United States Patent
Lee et al.

(10) Patent No.: US 10,403,861 B2
(45) Date of Patent: Sep. 3, 2019

(54) TOP-EMISSIVE ORGANIC LIGHT-EMITTING DIODE DISPLAY

(71) Applicant: LG Display Co., Ltd., Seoul (KR)

(72) Inventors: Jaesung Lee, Paju-si (KR); Seungwon Yoo, Paju-si (KR); Joonsuk Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/134,484

(22) Filed: Sep. 18, 2018

(65) Prior Publication Data

US 2019/0207168 A1    Jul. 4, 2019

(30) Foreign Application Priority Data

Dec. 28, 2017    (KR) ........................ 10-2017-0182076

(51) Int. Cl.
    *H01L 51/56*      (2006.01)
    *H01L 27/32*      (2006.01)
    (Continued)

(52) U.S. Cl.
    CPC .......... *H01L 51/56* (2013.01); *H01L 27/3223* (2013.01); *H01L 27/3244* (2013.01); *H01L 27/3246* (2013.01); *H01L 27/3248* (2013.01); *H01L 27/3258* (2013.01); *H01L 27/3272* (2013.01); *H01L 27/3276* (2013.01);
    (Continued)

(58) Field of Classification Search
    CPC ............. H01L 27/3246; H01L 27/3276; H01L 27/3244; H01L 51/5253; H01L 27/3258; H01L 2251/5315; H01L 27/3272; H01L 51/5228; H01L 27/3295
    See application file for complete search history.

(56) References Cited

U.S. PATENT DOCUMENTS 9,859,520 B2    1/2018    Kim
10,050,223 B2 *    8/2018    Im ........................... H01L 51/56
(Continued)

FOREIGN PATENT DOCUMENTS

EP            3026724 A1    6/2016
KR    10-2017-0063326 A    6/2017

OTHER PUBLICATIONS

Extended European Search Report, European Patent Application No. 18195087.4, Mar. 27, 2019, 8 pages.

*Primary Examiner* — Ngan V Ngo
(74) *Attorney, Agent, or Firm* — Fenwick & West LLP

(57) ABSTRACT

The present disclosure relates to a top-emissive organic light-emitting diode display. The organic light-emitting diode comprises a substrate, an auxiliary cathode, a passivation film, a planarization film, an under-cut opening, a connecting terminal, an under-area, a bank, an organic emission layer, and a cathode. The auxiliary cathode is placed on the substrate. The connecting terminal makes contact with the top surface of the one end exposed through the under-cut opening and protrudes into the under-cut opening, being longer in length than the one end of the auxiliary cathode. The under-area is formed between the end of the connecting terminal and the one end of the auxiliary cathode. The cathode is stacked on the organic emission layer, makes contact with the side of the connecting terminal not covered by the organic emission layer, and extends all the way to the under-area.

12 Claims, 11 Drawing Sheets

(51) Int. Cl.
*H01L 51/52* (2006.01)
*H01L 51/10* (2006.01)

(52) U.S. Cl.
CPC ........ *H01L 27/3295* (2013.01); *H01L 51/105* (2013.01); *H01L 51/5206* (2013.01); *H01L 51/5228* (2013.01); *H01L 51/5237* (2013.01); *H01L 51/5253* (2013.01); *H01L 2251/5315* (2013.01)

(56) References Cited

U.S. PATENT DOCUMENTS

| | | | |
|---|---|---|---|
| 10,177,206 B2* | 1/2019 | Jung | H01L 27/3246 |
| 2016/0013436 A1* | 1/2016 | Im | H01L 51/5206 |
| | | | 257/40 |
| 2016/0149155 A1* | 5/2016 | Kim | H01L 51/5228 |
| 2016/0293888 A1 | 10/2016 | Shim et al. | |
| 2017/0125495 A1* | 5/2017 | Lee | H01L 27/3246 |
| 2017/0125506 A1 | 5/2017 | Kim | |
| 2017/0125507 A1* | 5/2017 | Lee | H01L 27/3213 |
| 2018/0294328 A1* | 10/2018 | Kanaya | H01L 27/3276 |
| 2018/0366533 A1* | 12/2018 | Lee | H01L 51/5228 |
| 2019/0140038 A1* | 5/2019 | Lee | H01L 27/3276 |
| 2019/0140039 A1* | 5/2019 | Lee | G09G 3/3291 |

* cited by examiner

LS  BUF  AC  SUB

SA  LS  DA  BUF  AC  SUB

TOP-EMISSIVE ORGANIC LIGHT-EMITTING DIODE DISPLAY

This application claims the benefit of Republic of Korea Patent Application No. 10-2017-0182076 filed on Dec. 28, 2017, which is incorporated herein by reference in its entirety.

BACKGROUND DISCLOSURE

Field of Disclosure

The present disclosure relates to a top-emissive organic light-emitting diode display. More particularly, the present disclosure relates to a top-emissive organic light-emitting diode display that comprises an auxiliary cathode for reducing the surface resistance of a cathode and has an under-cut structure configured to directly connect the auxiliary electrode and the cathode.

Related Art

Recently, various flat-panel displays that are less bulky and more lightweight than cathode ray tubes (CRTs) are being developed. Examples of these flat panel displays include liquid crystal displays (LCDs), field emission displays (FEDs), plasma display panels (PDPs), electroluminescence devices (ELs), etc.

Electroluminescence displays are roughly classified into inorganic electroluminescence displays and organic light-emitting diode displays depending on the materials used for an emissive layer, and offer several advantages such as fast response time, high light-emission efficiency, high brightness, and wide viewing angle because of their self-emissive elements. Notably, there is a rapidly increasing demand for organic light-emitting diode displays, which have high energy efficiency and less leakage current and facilitate grayscale representation through current control.

In an organic light-emitting diode display, a cathode with a base voltage is applied across the entire surface of a display panel. Although there is no problem when the cathode is made of a metal material with low resistivity, there may be problems with image quality if the cathode is made of a transparent conductive material, due to its high surface resistance.

For example, the surface resistance increases if the cathode comprises a transparent conductive material or a material that has a higher resistivity than metals, such as indium tin oxide or indium zinc oxide, as in top-emissive displays. As a result, the voltage of the cathode may not be constant across the entire area of the display panel. The uneven brightness of the display device across the entire screen may become a more important issue, especially in the development of large-area organic light-emitting diode displays.

SUMMARY OF THE DISCLOSURE

The present disclosure has been made in an effort to overcome the aforementioned problems, and an aspect of the present disclosure is to provide a large-area organic light-emitting diode display that has good display quality because the surface resistance is low due to direct contact between a cathode and an auxiliary cathode. Another aspect of the present disclosure is to provide a large-area organic light-emitting diode display that comprises an auxiliary cathode and simplifies the manufacturing process.

An exemplary embodiment of the present disclosure provides an organic light-emitting diode comprising a substrate, an auxiliary cathode, a passivation film, a planarization film, an under-cut opening, a connecting terminal, an under-area, a bank, an organic emission layer, and a cathode. The auxiliary cathode is placed on the substrate. The passivation film covers the auxiliary cathode. The planarization film is stacked on the passivation film. The under-cut opening is formed in the passivation film and the planarization film and exposes one end of the auxiliary cathode. The connecting terminal makes contact with the top surface of the one end exposed through the under-cut opening and protrudes into the under-cut opening, being longer in length than the one end of the auxiliary cathode. The under-area is formed between the end of the connecting terminal and the one end of the auxiliary cathode. The bank lies on the planarization film and exposes the entire under-cut opening in a larger size than the under-cut opening. The organic emission layer covers the surface of the connecting terminal in the under-cut opening, and is not applied to the under-area and exposes the side of the connecting terminal. The cathode is stacked on the organic emission layer, makes contact with the side of the connecting terminal not covered by the organic emission layer, and extends all the way to the under-area.

In this embodiment, the under-cut opening comprises: one side where the sidewalls of the planarization film and passivation film are etched; and the other side that exposes the end of the connecting terminal and the one end of the auxiliary cathode, where the under-area is formed under the exposed end of the connecting terminal.

In this embodiment, the organic light-emitting diode display further comprises: a passivation film on the substrate that lies under the auxiliary cathode; an insulating film stacked under the passivation film; and an auxiliary line stacked under the insulating film and connected to the auxiliary cathode.

In this embodiment, the organic light-emitting diode display further comprises: a light shielding layer on the substrate that lies on the same level as the auxiliary line; a thin-film transistor on the light shielding layer that lies under the passivation film; a pixel contact hole formed in the planarization film that exposes part of the thin-film transistor; an anode on the planarization film that is connected to the thin-film transistor via the pixel contact hole, wherein the bank further comprises a light-emitting area that exposes the center of the anode, the organic emission layer is applied over the entire light-emitting area, the cathode is stacked on the organic emission layer in the light-emitting area, and the anode, the organic emission layer, and the cathode overlap to form an organic light-emitting diode in the light-emitting area.

In this embodiment, the connecting terminal has a three-layer structure comprising a metal material layer and transparent conductive layers stacked over and under the metal material layer.

In this embodiment, the organic light-emitting diode display further comprises: a buffer layer that covers the light shielding layer and the auxiliary line and is stacked under the insulating film; and source and drain electrodes of the thin-film transistor that lie over the insulating film, wherein the auxiliary cathode is formed on the interlayer insulating film and comprises the same material as the source and drain electrodes.

In this embodiment, in the under-cut opening, the one end of the auxiliary cathode, the end of the connecting terminal, and the cathode are physically and electrically connected by coming into direct contact with one another.

In this embodiment, the organic light-emitting diode display further comprises a dummy bank that comes into direct contact with the end of the auxiliary cathode in the under-area.

In this embodiment, the dummy bank comprises the same material as the bank.

In this embodiment, the auxiliary cathode comprises: a first passivation metal layer; a low-resistivity metal layer stacked on the first passivation metal layer; and a second passivation metal layer stacked on the low-resistivity metal layer.

In this embodiment, the under-cut opening comprises: one side where the sidewalls of the planarization film and passivation film are etched; and the other side that exposes the end of the connecting terminal and the one end of the auxiliary cathode, where the under-area is formed under the exposed end of the connecting terminal and the dummy bank fills part of the under-area.

In this embodiment, the cathode on one side of the under-cut opening extends to the dummy bank, and the cathode on the other side is physically and electrically connected to the connecting terminal by coming into contact with the connecting terminal, while wrapping the exposed end of the connecting terminal not covered by the organic emission layer, wherein the cathode and the auxiliary cathode are electrically connected via the connecting terminal.

The organic light-emitting diode display according to the present disclosure is provided as a large-area organic light-emitting diode display in which an auxiliary cathode is formed by using a shielding layer for protecting a metal oxide semiconductor material from light coming from the outside. The auxiliary cathode and the cathode may be physically and electrically connected, without an additional mask process, by forming an under-cut structure in a passivation film patterning process. The present disclosure provides a large-area organic light-emitting diode display because of its structure capable of reducing the resistance of the cathode. Moreover, the manufacturing time and costs can be reduced by reducing the number of mask processes.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

In the drawings.

DETAILED DESCRIPTION

Figure 1:
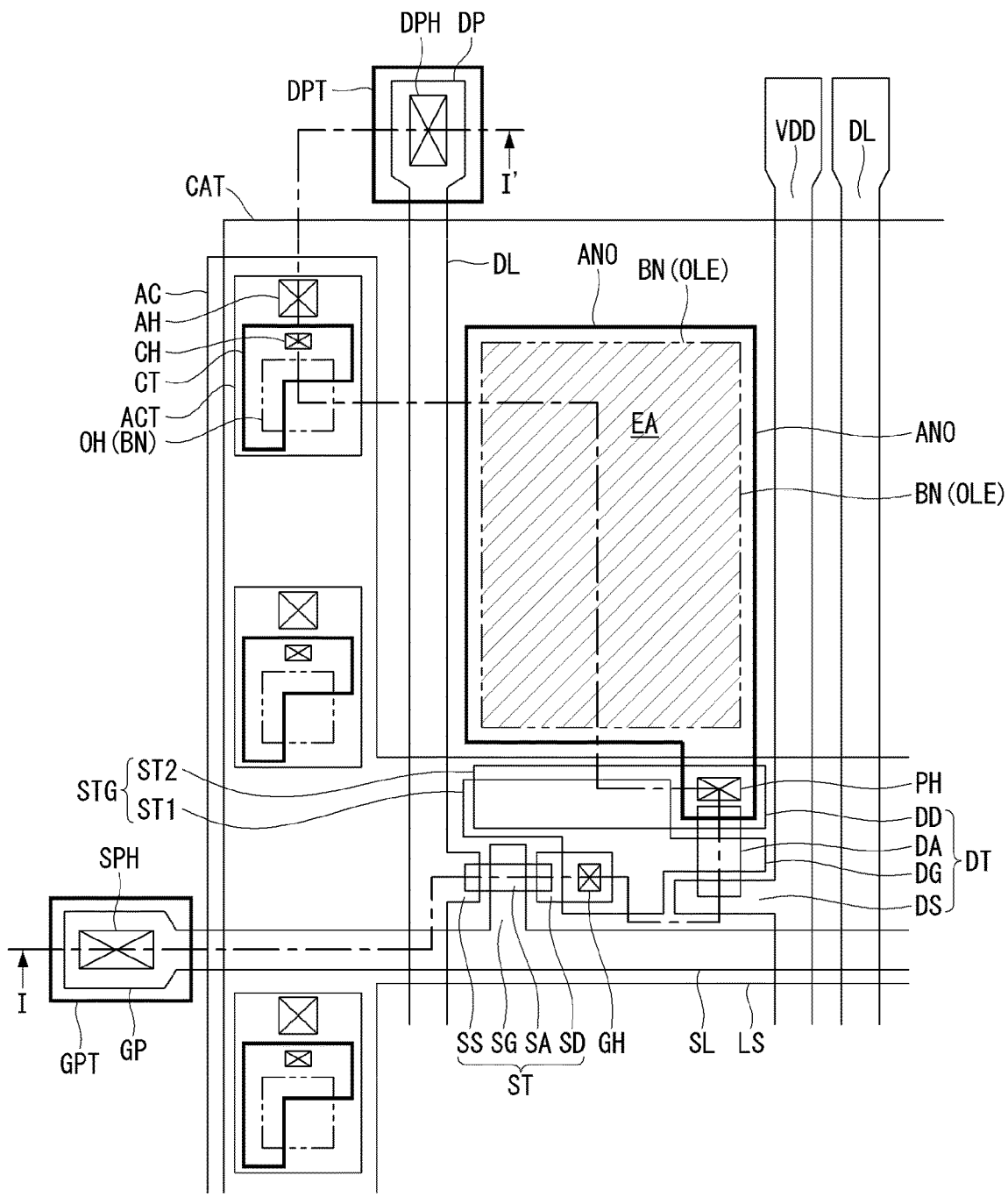
FIG. 1 is a plan view of a structure of an organic light-emitting diode display according to the present disclosure.

Various aspects and features of the present disclosure and methods of accomplishing them may be understood more readily by reference to the following detailed descriptions of exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the present disclosure to those skilled in the art, and the present disclosure is defined by the appended claims.

The shapes, sizes, proportions, angles, numbers, etc. shown in the figures to describe the exemplary embodiments of the present disclosure are merely examples and not limited to those shown in the figures. Like reference numerals denote like elements throughout the specification.

In describing the present disclosure, detailed descriptions of related well-known technologies will be omitted to avoid unnecessary obscuring the present disclosure. When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated. When the position relation between two parts is described using the terms "on", "over", "under", "next to" and the like, one or more parts may be positioned between the two parts as long as the term "immediately" or "directly" is not used.

It will be understood that, although the terms "first", "second", etc. may be used herein to describe various elements, these elements are not limited by these terms. These terms are used to distinguish one element from another element. The terms and names of elements used herein are chosen for ease of description and may be different from the names of parts used in actual products.

The features of various exemplary embodiments of the present disclosure may be coupled or combined with one another either partly or wholly, and may technically interact or work together in various ways. The exemplary embodiments may be carried out independently or in connection with one another.

Hereinafter, exemplary embodiments of the present disclosure will be described in detail with reference to the accompanying drawings. In the exemplary embodiments below, the description of an electroluminescence display will focus on an organic light-emitting display comprising organic light-emitting material. However, it should be noted that the technical idea of the present disclosure is not limited to organic light-emitting displays but also may apply to inorganic light-emitting displays comprising inorganic light-emitting material.

<First Exemplary Embodiment>

Figure 2:
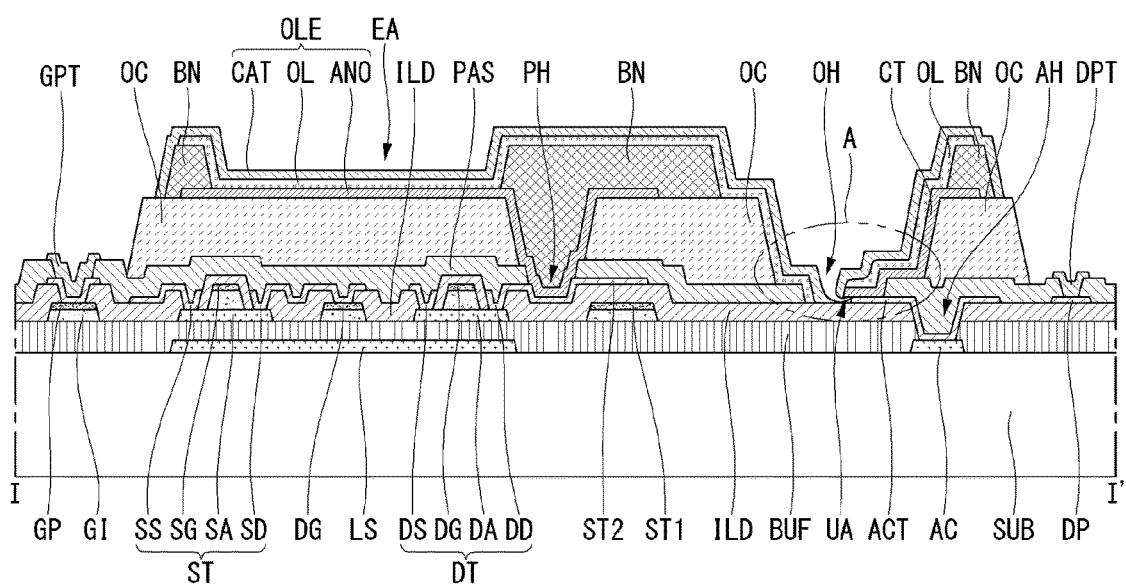
FIG. 2 is a cross-sectional view of the organic light-emitting diode display according to the first exemplary embodiment of the present disclosure, taken along the line I-I' in FIG. 1.
Figure 3:
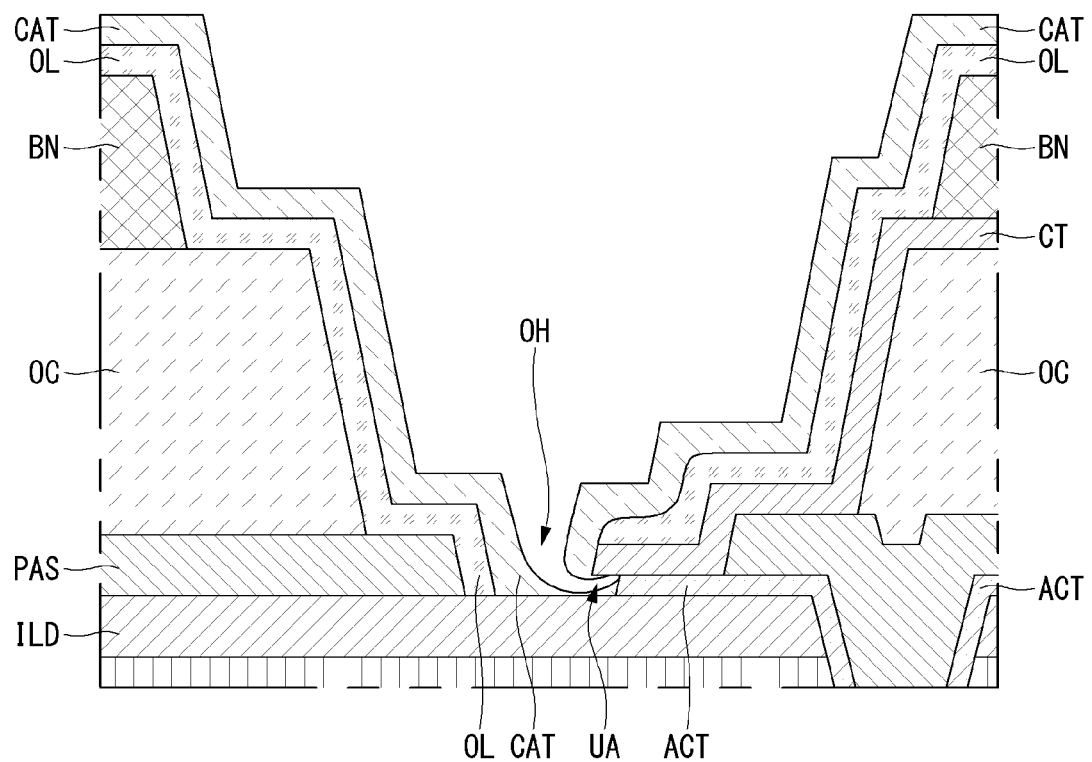
FIG. 3 is an enlarged cross-sectional view of a structure of the under-cut opening of FIG. 2 where the cathode and auxiliary cathode are connected.

Hereinafter, a structure of an organic light-emitting diode display according to a first exemplary embodiment of the present disclosure will be described with reference to FIGS. 1 to 3. FIG. 1 is a plan view of a structure of an organic light-emitting diode display according to the present disclosure. FIG. 2 is a cross-sectional view of the organic light-emitting diode display according to the first exemplary embodiment of the present disclosure, taken along the line I-I' in FIG. 1. FIG. 3 is an enlarged cross-sectional view of a structure of the under-cut opening of FIG. 2 where the cathode and auxiliary cathode are connected.

The organic light-emitting diode display according to the first exemplary embodiment of the present disclosure comprises a plurality of pixel regions arranged in a matrix on a substrate SUB. The organic light-emitting diode display comprises a scan line SL that runs horizontally on the substrate SUB and a data line DL and a drive current line VDD that run vertically on the substrate SUB. The pixel regions are defined by the intersections of the scan line SL, data line DL, and drive current line VDD. The scan lines SL is connected to a gate pad terminal GPT and the data lines DL is connected to a data pad terminal DPT. The gate terminal GPT has a gate pad GP and a gate pad contact hole GPH and the data pad terminal DPT has a data pad DP and a data pad contact hole DPH. For example, the gate pad terminal GPT and data pad terminal DPT are formed of a metal oxide such as ITO or IZO but not limit thereto.

In each pixel region, an organic light-emitting diode OLE and thin-film transistors, which are driving elements for driving the organic light-emitting diode OLE, are placed. The thin-film transistors comprise a switching thin-film transistor ST and a driving thin-film transistor DT. The switching thin-film transistor ST comprises a switching gate electrode SG, a switching semiconductor layer SA, a switching source electrode SS, and a switching drain electrode SD. The switching gate electrode SG is connected to the scan line SL. The switching semiconductor layer SA and the central area of the switching gate electrode SG overlap each other, with a gate insulating film GI between them. The switching source electrode SS and the switching drain electrode SD are placed on either side of the switching gate electrode SG, and are connected to one side and the other side of the switching semiconductor layer SA, respectively.

The driving thin-film transistor DT comprises a driving gate electrode DG, a driving semiconductor layer DA, a driving source electrode DS, and a driving drain electrode DD. The driving gate electrode DG is connected to the switching drain electrode SD. The driving semiconductor layer DA and the central area of the driving gate electrode DG overlap each other, with the gate insulating film GI between them. The driving source electrode DS and the driving drain electrode DD are placed on either side of the driving gate electrode DG, and are connected to one side and the other side of the driving semiconductor layer DA, respectively.

The organic light-emitting diode OLE comprises an anode ANO, an organic emission layer OL, and a cathode CAT. The anode ANO is connected to the driving thin-film transistor DT. The organic emission layer OL is stacked on the anode ANO. Particularly, a light-emitting area EA is defined in the anode ANO by a bank BN. The organic emission layer OL is applied to the entire surface of the substrate SUB, and makes contact with the anode ANO in the light-emitting area EA. The cathode CAT also is applied onto the entire surface of the substrate SUB. In the light-emitting area EA, the anode ANO, the organic emission layer OL, and the cathode CAT are sequentially stacked to form the organic light-emitting diode OLE.

In the case of a top-emissive organic light-emitting diode display, light is directed from the anode ANO toward the cathode CAT in FIG. 2. Thus, it is desirable that the anode ANO comprises an opaque metal material and the cathode CAT comprises a transparent conductive material. The cathode CAT is an electrode that maintains a base voltage in the organic light-emitting diode OLE, and preferably may maintain a constant voltage. If the cathode CAT comprises a transparent conductive material, such as indium tin oxide or indium zinc oxide, which has a much higher resistivity than metals, it is difficult to maintain a constant base voltage in a large-area organic light-emitting diode display. Thus, it is desirable to reduce surface resistance by forming an auxiliary line AC and/or an auxiliary cathode ACT from metal material and connecting them to the cathode CAT.

To this end, in the first exemplary embodiment of the present disclosure, the organic light-emitting diode display further comprises an auxiliary line AC, an auxiliary cathode ACT, and a connecting terminal CT that are placed in a non-light-emitting area surrounding the light-emitting area EA. The auxiliary line AC may be made of the same metal material having low-resistivity properties on the same level as a light shielding layer LS that lies under the thin-film transistors ST and DT. The auxiliary cathode ACT may be made of the same material on the same level as the source and drain electrodes of the thin-film transistors ST and DT. The connecting terminal CT may be made of the same material on the same level as the anode ANO.

The auxiliary line AC may be formed separately from the light shielding layer LS, or may be connected to the light shielding layer LS to form a mesh pattern on the substrate SUB. A buffer layer BUF is applied over the auxiliary line AC. The auxiliary cathode ACT may be made of the same material on the same level as the source and drain electrodes of the thin-film transistors ST and DT formed on the buffer layer BUF, but separately from them. In this case, the auxiliary cathode ACT is connected to the auxiliary line AC via an auxiliary line contact hole AH formed through an interlayer insulating film ILD and the buffer layer BUF which are stacked under the source and drain electrodes.

A passivation film PAS is deposited on the auxiliary cathode ACT. A planarization film OC is deposited on the passivation film PAS. The anode ANO and the connecting terminal CT are formed on the planarization film OC. The auxiliary cathode ACT and the connecting terminal CT may be physically connected to each other, directly or indirectly. The connection terminal CT is connected to the auxiliary cathode ACT through a connection contact hole CH formed in the passivation layer PAS. Here, it is assumed that they are connected directly. The connecting terminal CT is connected to the auxiliary cathode ACT via an under-cut opening OH formed by partially etching the planarization film OC and the passivation film PAS.

Moreover, the under-cut opening OH formed through the planarization film OC and the passivation film PAS exposes part of the auxiliary cathode ACT. One side of the under-cut opening OH exposes sidewalls of the planarization film OC and passivation film PAS. The other side of the under-cut opening OH exposes the end of the connecting terminal CT. The connecting terminal CT is exposed through the other side of the under-cut opening OH in order to form an under-area UA by overetching the auxiliary cathode ACT stacked under the connecting terminal CT by using the connecting terminal CT.

The under-cut opening OH may have a polygonal shape. For convenience of explanation, the under-cut opening OH in FIG. 1 has a rectangular shape, but not limited to it. For example, the under-cut opening OH may have two opposite sides. On one of the two opposite sides, the etched sidewall of the planarization film OC and the etched sidewall of the passivation film PAS are exposed. On the other side, the connecting terminal CT is exposed, and the under-area UA is formed by overetching the auxiliary cathode ACT lying under the connecting terminal CT.

The passivation film PAS in the under-cut opening OH is removed. Particularly, on the other side of the under-cut opening OH, part of the auxiliary cathode ACT stacked under the connecting terminal CT is overetched, thereby exposing part of the undersurface of the connecting terminal CT. A cave-like space in the under-cut opening OH, formed by over etching the auxiliary cathode ACT under the connecting terminal CT, is defined as the under-area UA.

The under-area UA is formed by partially removing the auxiliary cathode ACT, with its top being blocked by the connecting terminal CT so as to prevent the organic emission layer OL from being applied to the under-area UA. On the other hand, the cathode CAT is deposited all the way into the under-area UA, coming into direct contact with the auxiliary cathode ACT and the connecting terminal CT. An enlarged view of the connecting structure of the cathode CAT and the auxiliary cathode ACT using the under-area UA is shown in FIG. 3. FIG. 3 is an enlarged cross-sectional view of the under-cut opening indicated by the circle 'A' in FIG. 2 where the cathode and auxiliary cathode are connected.

The organic emission layer OL is not applied to the under-area UA blocked by the connecting terminal CT because it is an organic material heated and deposited by a thermal deposition technique. On the other hand, a metal oxide material such as ITO or IZO, is deposited by a sputtering technique, all the way to the under-area UA blocked by the connecting terminal CT.

Moreover, the organic emission layer OL is applied only to the top surface of the connecting terminal CT. On the other hand, the cathode CAT is deposited all the way to the underside of the connecting terminal CT blocking the under-area UA, and the connecting terminal CT is physically and electrically connected to the cathode CAT.

That is, in the under-cut opening of the organic light-emitting diode display according to the first exemplary embodiment of the present disclosure, the cathode CAT is connected to the auxiliary cathode ACT and the connecting terminal CT. Also, the auxiliary cathode ACT is connected to the auxiliary line AC. Thus, the cathode CAT made of a transparent conductive material with high resistivity may have low surface resistance because the auxiliary cathode ACT and the auxiliary line AC are made of a metal material with very low resistivity.

Hereinafter, a manufacturing process of the organic light-emitting diode display according to the first exemplary embodiment of the present disclosure will be described with reference to FIGS. 4A to 4J. FIGS. 4A to 4J are cross-sectional views of a manufacturing process of the organic light-emitting diode display according to the first exemplary embodiment of the present disclosure.

Figure 4A:
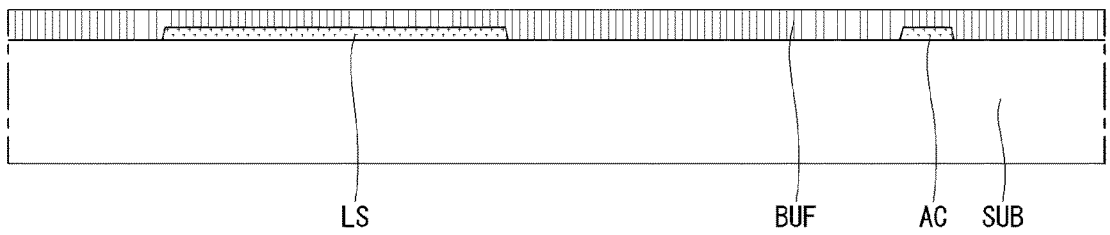
FIGS. 4A to 4J are cross-sectional views of some of the steps of a manufacturing process of the organic light-emitting diode display according to the first exemplary embodiment of the present disclosure.

An opaque metal material is applied onto a substrate SUB. In a first mask process, the metal material is patterned to form a light shielding layer LS and an auxiliary line AC. A buffer layer BUF is formed over the entire surface of the substrate SUB where the light shielding layer LS and the auxiliary line AC are formed. The light shielding layer LS is placed where thin-film transistors are to be formed. For example, the shielding layer SHL may have the shape of a strip that runs horizontally across the substrate SUB. The auxiliary line AC may have the shape of a strip that runs horizontally or vertically across the substrate SUB. The auxiliary line AC may be disconnected from the light shielding layer LS or connected to it. Here, as shown in FIG. 2, the auxiliary line AC is illustrated as a line that is connected to the light shielding layer LS and runs vertically across the substrate SUB (FIG. 4A).

Figure 4B:
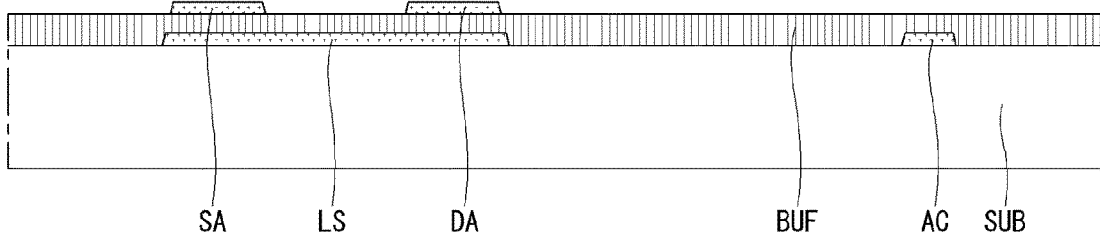

A semiconductor material is applied on the buffer layer BUF. In a second mask process, the semiconductor material is patterned to form a semiconductor layer. The semiconductor layer comprises a switching semiconductor layer SA of a switching thin-film transistor ST and a driving semiconductor layer DA of a driving thin-film transistor DT (FIG. 4B).

Figure 4C:
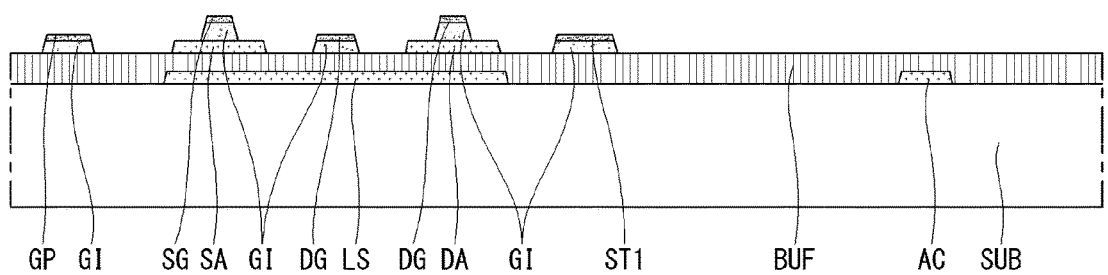

An insulating material layer and a metal material layer are deposited in a row over the entire surface of the substrate SUB where the semiconductor layers SA and DA are formed. In a third mask process, the metal material layer and the insulating material layer are patterned simultaneously to form a gate insulating film GI, a scan line SL, a gate pad GP, a first auxiliary capacitor electrode ST1, and gate electrodes. The gate electrodes comprise a switching gate electrode SG of the switching thin-film transistor ST and a driving gate electrode DG of the driving thin-film transistor DT. The switching gate electrode SG and the center of the switching thin-film transistor SA overlap each other, with the gate insulating film GI between them. The driving gate electrode DG and the center of the driving thin-film transistor DA overlap each other, with the gate insulating film GI between the driving gate electrode DG and the driving semiconductor layer DA (FIG. 4C).

Figure 4D:
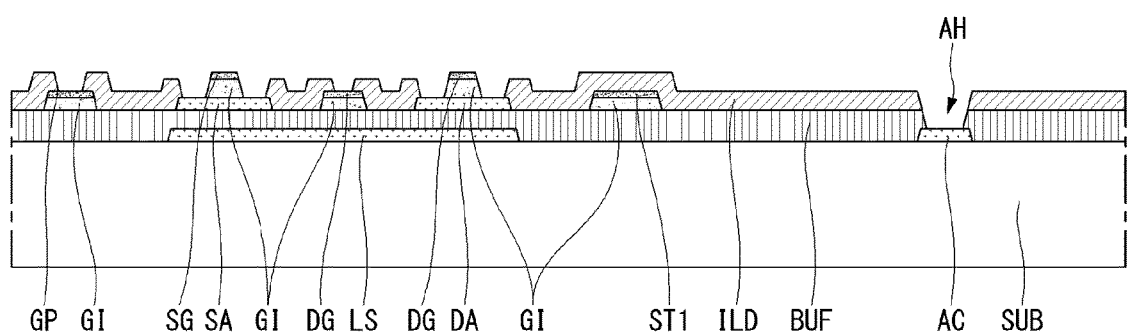

An interlayer insulating film ILD is applied over the entire surface of the substrate SUB where the scan line SL, the gate line GP, and the gate electrodes SG and DG are formed. In a fourth mask process, the interlayer insulating film ILD is patterned to form contact holes. The contact holes expose two opposite sides of the switching thin-film transistor ST and driving thin-film transistor DT. The two opposite sides are either side of the gate electrodes SG and DG of the semiconductor layers SA and DA. Also, they expose part of the driving gate electrode DG. Moreover, an auxiliary line contact hole AH is formed through the interlayer insulating film ILD and the buffer layer BUF to expose part of the auxiliary line AC (FIG. 4D).

Figure 4E:
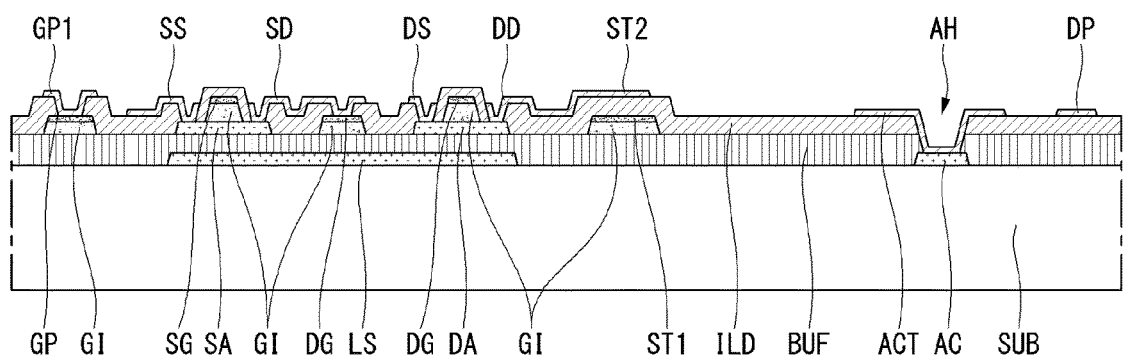

A metal material is applied on the interlayer insulating film ILD in which contact holes including the auxiliary line contact hole AH are formed. In a fifth mask process, the metal material is patterned to form a data line DL, a drive current line VDD, an auxiliary cathode ACT, a second auxiliary capacitor electrode ST2, and source and drain electrodes. The source and drain electrodes comprise a scan source electrode SS, a scan drain electrode SD, a driving source electrode DS, and a driving drain electrode DD. The scan source electrode SS is branched from the data line DL. The driving source electrode DS is branched from the driving current line VDD. A data pad DP is placed at the end of the data line DL, and a driving pad VDP is placed at the end of the drive current line VDD. Also, a gate pad connecting terminal GP1 is formed at the gate pad GP. The second auxiliary capacitor electrode ST2 extends from the driving drain electrode DD, and overlaps the first auxiliary capacitor electrode ST1, with the interlayer insulating film ILD between them (FIG. 4E).

Figure 4F:
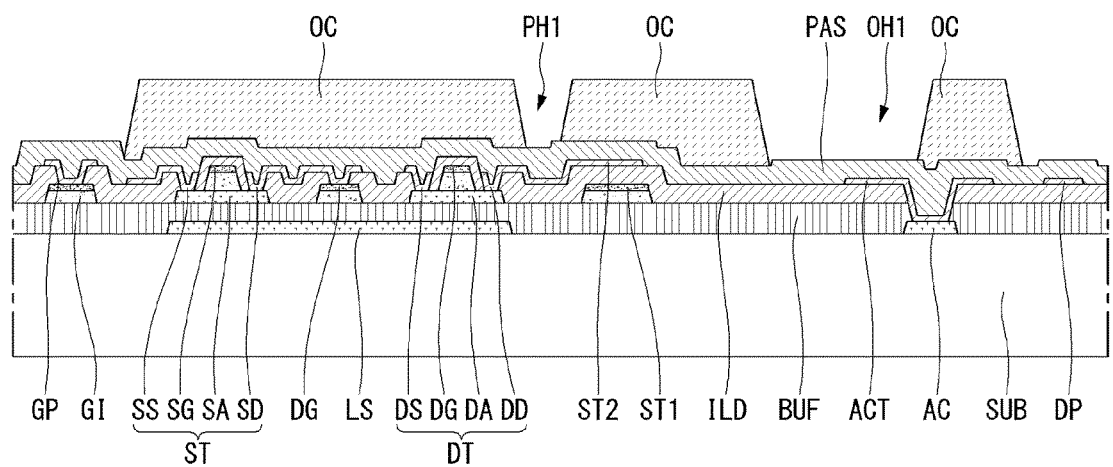

A passivation film PAS is applied over the entire surface of the substrate SUB where the source and drain electrodes are formed. Subsequently, a planarization film OC is applied on the passivation film PAS. In a sixth mask process, the planarization film OC is patterned to form a first pixel contact hole PH1 and a first under-cut opening OH1. In this instance, it is desirable that the planarization film OC in the area above the gate pad GP and data pad DP also is removed. The first under-cut opening OH1, which is a part for exposing the auxiliary cathode ACT, is preferably formed in the non-light-emitting area where the organic light-emitting diode is not placed (FIG. 4F).

Figure 4G:
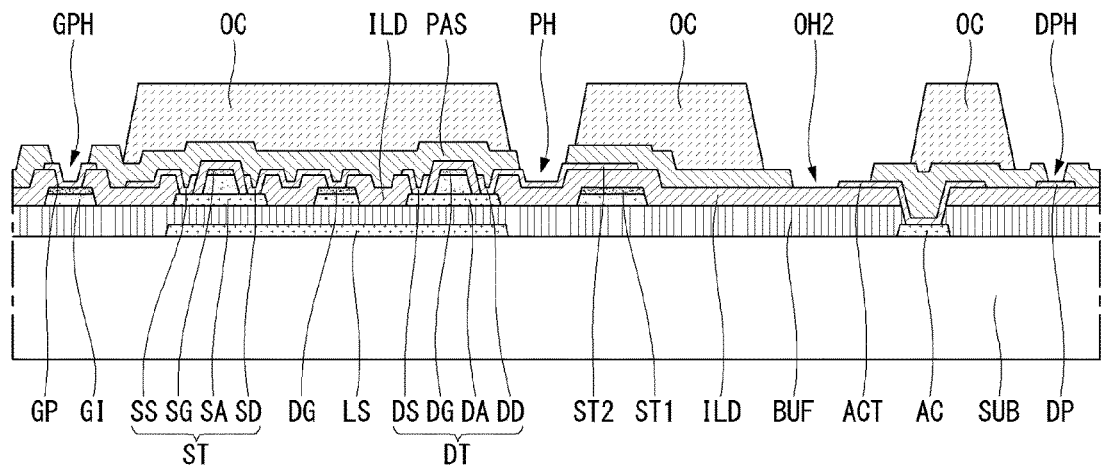

In a seventh mask process, the exposed passivation film PAS is patterned to form a gate pad contact hole GPH, a data pad contact hole DPH, a pixel contact hole PH, and a second under-cut opening OH2. The gate pad contact hole GPH exposes the gate pad connecting terminal GP1. The data pad contact hole DPH exposes the data pad terminal DP. The pixel contact hole PH exposes one end of the driving drain electrode DD. The second under-cut opening OH2 may be the same size as the first under-cut opening OH1 For convenience, the description will be given on the assumption that the second under-cut opening OH2 is a size small enough to fit into the first under-cut opening OH1 (FIG. 4G).

A metal material is deposited over the entire surface of the substrate SUB where the planarization film OC comprising the contact holes GPH, DPH, and PH and the second under-cut opening OH2 is formed. Preferably, the metal material is three layers of metal formed by sequentially stacking indium tin oxide, molybdenum titanium alloy, and indium tin oxide. Here, the molybdenum titanium stacked in the middle may be replaced with silver (Ag) or aluminum (Al). In an eighth mask process, the metal material is patterned to form an anode ANO and a connecting terminal CT. The anode ANO is shaped to take up most of the center of the pixel region.

Figure 4H:
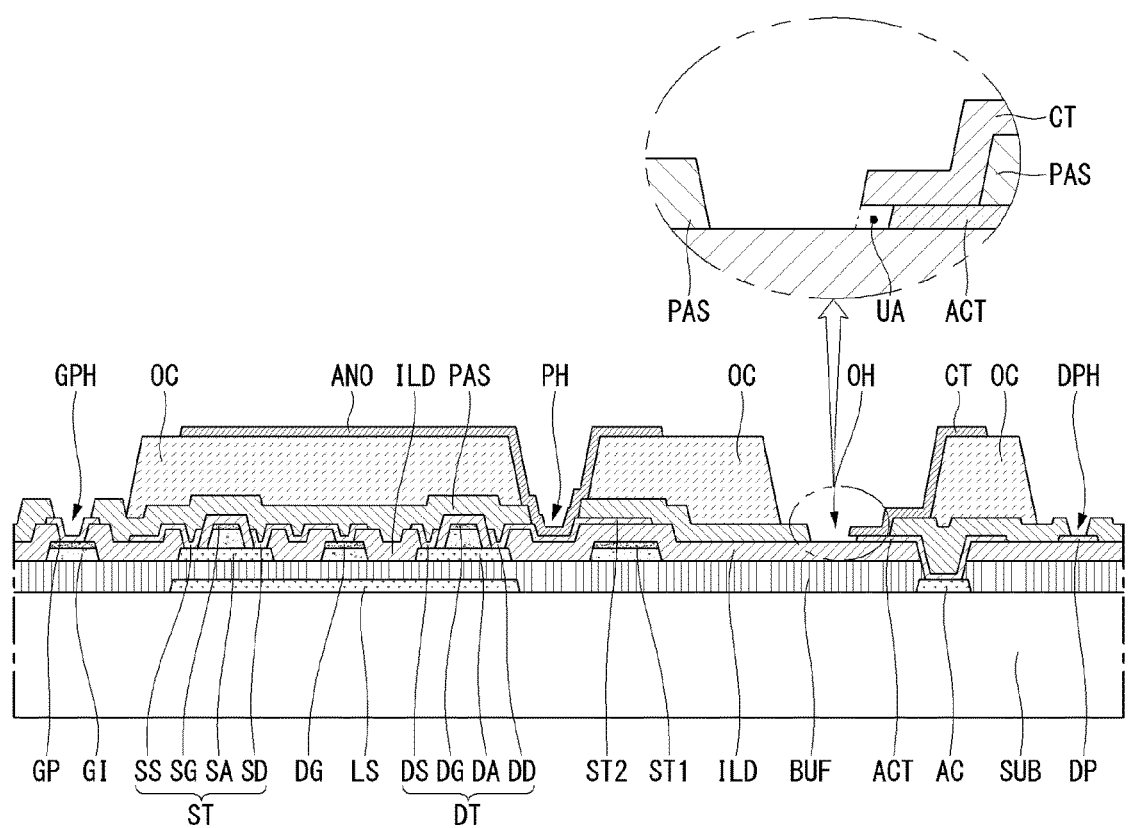

In the eighth mask process, it is preferable to over etch the auxiliary cathode ACT making contact with the underside of the connecting terminal CT by adjusting the etching time in an etching process in which the anode ANO and the connecting terminal CT are formed. As a result, the end of the auxiliary cathode ACT making contact with the undersurface of the connecting terminal CT is partially etched away to form an under-area UA under the connecting terminal CT. As such, an under-cut opening OH comprising the under-area UA is formed. On one side of the under-cut opening OH is a sidewall formed by etching the planarization film OC and the passivation film PAS. On the other side, the end of the auxiliary cathode ACT and the end of the overlying connecting terminal CT making contact with the auxiliary cathode ACT are exposed. Particularly, the end of the auxiliary cathode ACT is recessed to a certain depth further inward than the end of the connecting terminal CT (FIG. 4H).

Figure 4I:
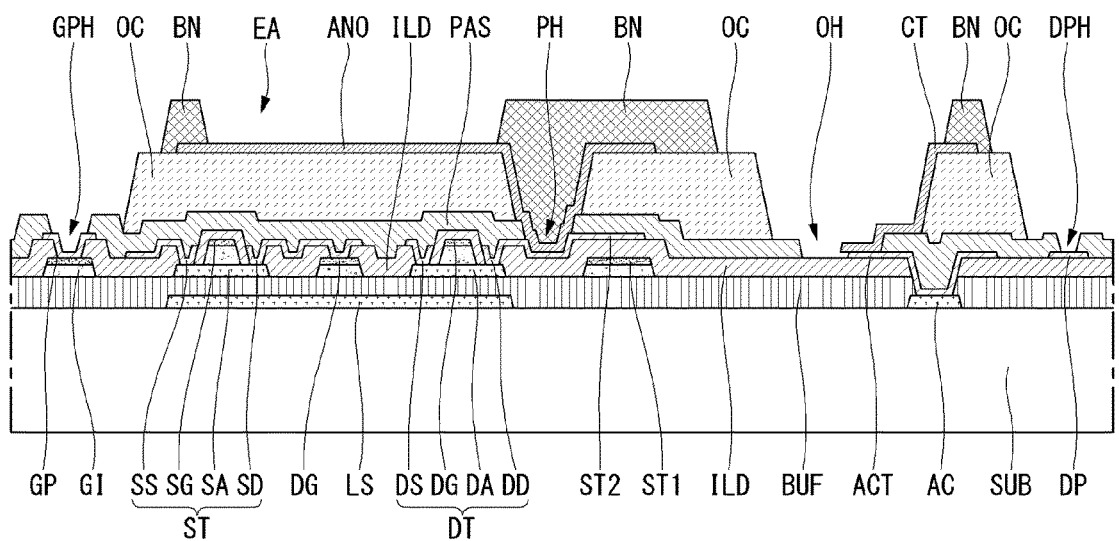

An organic material is applied over the entire surface of the substrate SUB where the anode ANO and the connecting terminal CT are formed. In a ninth mask process, the organic material is patterned to form a bank BN. The bank BN exposes most of the anode ANO and defines the light-emitting area EA. Also, the bank BN exposes the entire under-cut opening OH. That is, the bank BN has an open area smaller than the anode ANO and an open area larger than the under-cut opening OH (FIG. 4I).

An organic emission layer OL is applied over the entire surface of the substrate SUB where the bank BN is formed. The organic emission layer OL is an organic material that is applied by a thermal deposition process. The organic emission layer OL is applied to cover the surface of the bank BN and the top of the anode ANO. In the under-cut opening OH, the organic emission layer OL is applied over only some part of the exposed surface of the auxiliary cathode ACT. Particularly, in the under-area UA, the organic emission layer OL is not applied, but the side of the auxiliary cathode ACT is exposed directly.

After applying the organic emission layer OL, a transparent conductive material is then applied to form the cathode CAT. The transparent conductive material comprises indium tin oxide (ITO) or indium zinc oxide (IZO). The transparent conductive material is formed by a sputtering technique. In the light-emitting area EA, the cathode CAT is stacked on top of the anode ANO and the organic emission layer OL, thereby forming the organic light-emitting diode OLE.

Figure 4J:
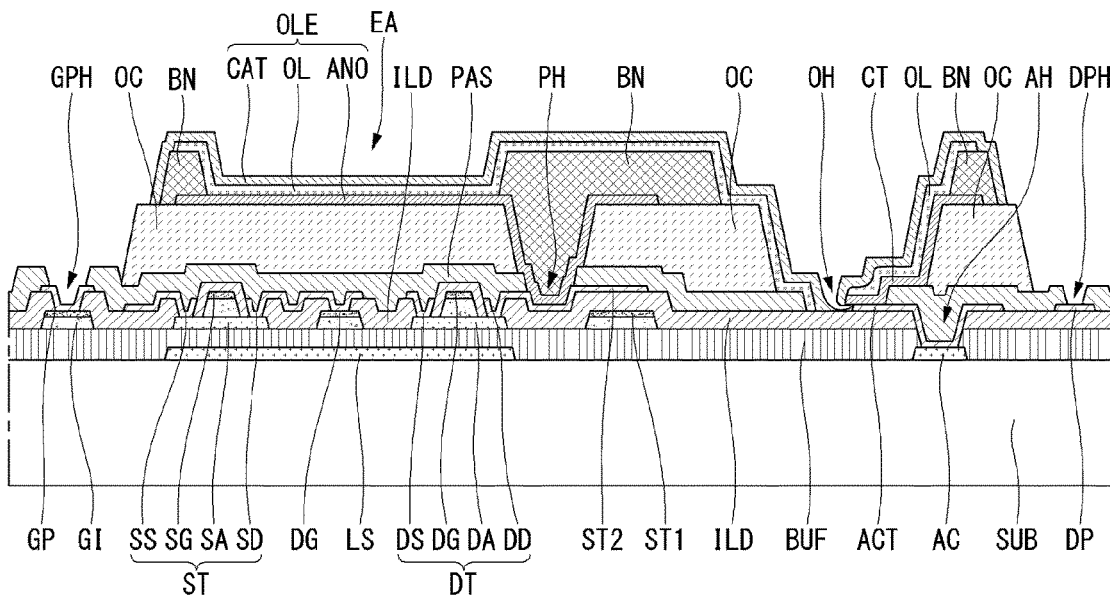

The cathode CAT deposited by the sputtering technique tends to be deposited along the bends on the surface. Also, the metal materials formed by the sputtering technique tend to accumulate one upon another as if the deposited particles grow. Thus, the cathode CAT is deposited in the area where the organic emission layer OL is not applied, as well as on the surface of the organic emission layer OL. That is, in the under-cut opening OH, the cathode CAT is deposited along the sloping surface on one side where the connecting terminal CT is not formed, and extends all the way to the under-area UA. As a result, the cathode CAT penetrates into the under-area UA where the organic emission layer OL is not applied, and comes into direct contact with the side of the auxiliary cathode ACT. Moreover, the cathode CAT comes into direct contact with the exposed side of the connecting terminal CT in the under-cut opening OH, which is not covered by the organic emission layer OL. Particularly, the connecting terminal CT protrudes from the top of the auxiliary cathode ACT, and the cathode CAT extends as if to wrap the exposed part not covered by the organic emission layer OL (FIG. 4J).

In the under-cut opening OH, the auxiliary cathode ACT, the connecting terminal CT, and the cathode CAT are sequentially brought into contact with one another. The auxiliary cathode ACT is connected to the auxiliary line AC via the auxiliary contact hole AH. As a result, the cathode CAT is connected to the auxiliary line AC made of low-resistivity material, thereby maintaining low surface resistance.

<Second Exemplary Embodiment>

Figure 5:
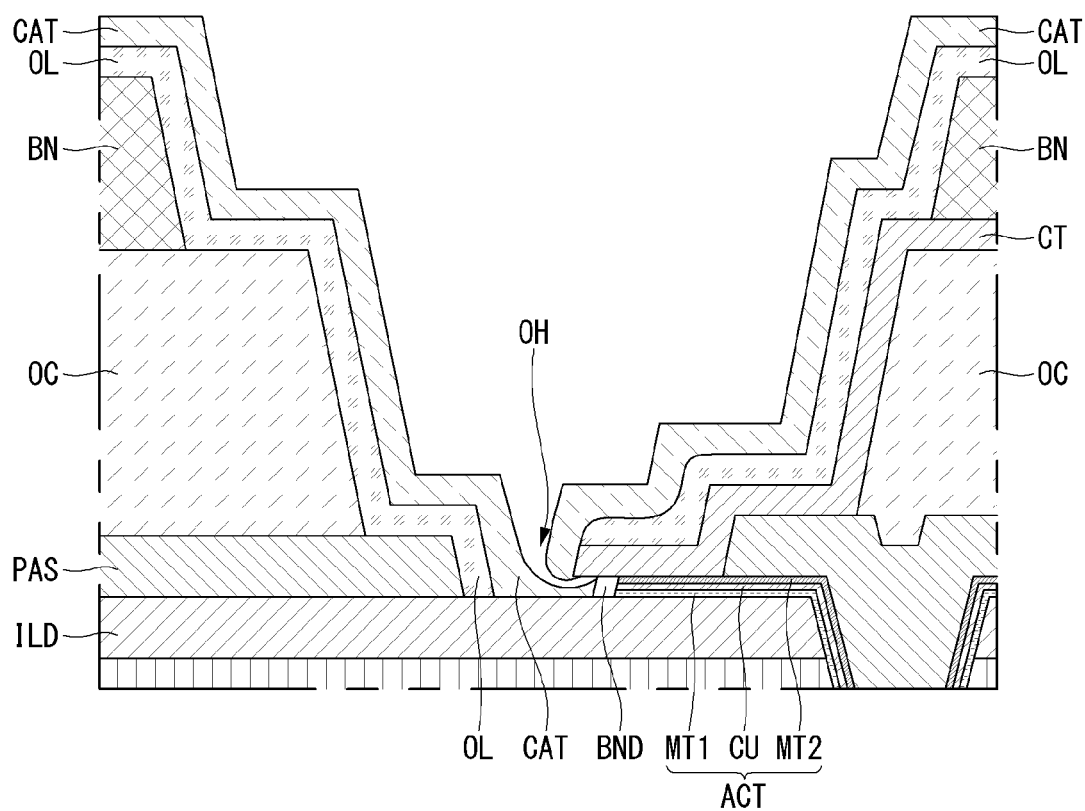
FIG. 5 is an enlarged cross-sectional view of a structure of an under-cut opening where a cathode and an auxiliary cathode are connected, in an organic light-emitting diode display according to a second exemplary embodiment of the present disclosure taken along the line I-I' in FIG. 1.

Hereinafter, a second exemplary embodiment of the present disclosure will be described with reference to FIG. 5. The basic configuration of an organic light-emitting diode display according to the second exemplary embodiment is identical to that of the first exemplary embodiment. The only difference is the structure of part of the under-cut opening OH. Thus, the description below focuses on the structure of the under-cut portion. The description will be given referring again to FIG. 1 because no difference is found on the plane. The manufacturing process also is identical to that of the first exemplary embodiment, except for the difference in the type of material used. Thus, a description of the process, if required, will be given referring to the drawings of the first exemplary embodiment. FIG. 5 is an enlarged cross-sectional view of a structure of an under-cut opening where a cathode and an auxiliary cathode are connected, in an organic light-emitting diode display according to a second exemplary embodiment of the present disclosure taken along the line I-I' in FIG. 1.

The second exemplary embodiment proposes a structure that is generally applied to a large-area, top-emissive organic light-emitting diode display according to the present disclosure. In the large-area display, the data line DL is longer. Therefore, it is necessary that the data line DL be made of a low-resistivity material. For example, the data line DL and the source and drain electrodes and auxiliary cathode ACT made of the same material on the same level as the data line DL may be made of a low-resistivity material such as copper (Cu).

Copper corrodes readily on its surface when exposed to heat in the manufacturing process. Copper, if it is formed on an insulating material or covers the insulating material, may have unstable interfacial characteristics or have an impurity such as a hillock or may be peeled off or come off. To prevent this problem, it is preferable to use a three-layer structure in which underlying and overlying passivation metal layers are stacked, rather than using a single layer of copper Cu. For example, the data line DL, source and drain electrodes, and auxiliary cathode ACT may have a three-layer structure in which a lower passivation metal layer MT1 comprising molybdenum-titanium (Mo—Ti) alloy, a low-resistivity metal layer CU comprising copper, and an upper passivation metal layer MT2 comprising molybdenum-titanium (Mo—Ti) alloy are sequentially stacked.

After forming the under-area UA by overetching the auxiliary cathode ACT having the three-layer structure as shown in FIG. 4H, the sidewall of the stack of the lower passivation metal layer MT1, low-resistivity metal layer CU, and upper passivation metal layer MT2 is exposed directly. Afterwards, the anode ANO and the connecting terminal CT are formed, and oxidation may occur on the low-resistivity metal layer CU comprising copper exposed in a thermal treatment process for device stabilization. Unless this oxidation is prevented, corrosion may progress over time, causing defects throughout the auxiliary cathode ACT.

To prevent this, in the second exemplary embodiment, after forming the anode ANO and the connecting terminal CT, the bank BN is left in the under-area UA upon formation of the bank BN shown in FIG. 4I, so that a dummy bank BND is provided to protect the etched side of the auxiliary cathode ACT. With the dummy bank BND filling part of the under-area UA, corrosion on the etched side of the auxiliary cathode ACT may be avoided. However, the cathode CAT and the auxiliary cathode ACT do not come into direct contact with each other due to the dummy bank BND.

During the formation process using sputtering, the cathode CAT may extend along the side of the dummy bank BND filling part of the under-area UA and come into direct contact with the underside of the overlying connecting terminal CT. That is, as shown in FIG. 5, the cathode CAT may extend from one side of the under-cut opening OH according to the second exemplary embodiment, along the sidewall of the dummy bank BND filling part of the under-area UA, and come into contact with the undersurface of the overlying connecting terminal CT. Moreover, on the other side, the cathode CAT extends as if to wrap the side and bottom of the exposed end of the connecting terminal CT which are not covered by the organic emission layer OL.

The dummy bank BND filling part of the under-area UA may be formed by adjusting the amount of exposure in a photolithography process for forming the bank BN described with respect to FIG. 4I. For example, the bank BN may be left in some of the space in the under-area UA by adjusting exposure time or exposure energy. Alternatively, the bank BN may be left in the under-area UA by reducing the amount of exposure using a half-tone mask, thereby forming the dummy bank BND.

While the embodiment of the present disclosure has been described in detail with reference to the drawings, it will be understood by those skilled in the art that the disclosure can be implemented in other specific forms without changing the technical spirit or essential features of the disclosure. Therefore, it should be noted that the forgoing embodiments are merely illustrative in all aspects and are not to be construed as limiting the disclosure. The scope of the disclosure is defined by the appended claims rather than the detailed description of the disclosure. All changes or modifications or their equivalents made within the meanings and scope of the claims should be construed as falling within the scope of the disclosure.

What is claimed is:

1. An organic light-emitting diode display comprising:
   an auxiliary cathode placed on a substrate;
   a passivation film covering the auxiliary cathode;
   a planarization film stacked on the passivation film;
   an under-cut opening formed in the passivation film and the planarization film, exposing an end of the auxiliary cathode;
   a connecting terminal that makes contact with a top surface of the end of the auxiliary cathode exposed through the under-cut opening, an end of the connecting terminal protruding into the under-cut opening, the end of the connecting terminal being longer in length than the end of the auxiliary cathode;
   an under-area formed between the end of the connecting terminal and the end of the auxiliary cathode;
   a bank that lies on the planarization film and exposes the entire under-cut opening in a larger size than the under-cut opening;
   an organic emission layer that is in direct contact with a top surface of the connecting terminal in the under-cut opening, and is not applied to the under-area and exposes a side of the connecting terminal; and
   a cathode that is stacked on the organic emission layer, the cathode making contact with the side of the connecting terminal not covered by the organic emission layer, and extends into the under-area.

2. The organic light-emitting diode display of claim 1, wherein the under-cut opening comprises:
   a first side where sidewalls of the planarization film and passivation film are etched; and
   a second side that exposes the end of the connecting terminal and the end of the auxiliary cathode, where the under-area is formed under the exposed end of the connecting terminal.

3. The organic light-emitting diode display of claim 1, further comprising:
   a passivation film on the substrate that lies under the auxiliary cathode;
   an insulating film stacked under the passivation film; and
   an auxiliary line stacked under the insulating film and connected to the auxiliary cathode.

4. The organic light-emitting diode display of claim 1, further comprising:
   a light shielding layer on the substrate that lies on a same level as an auxiliary line;
   a thin-film transistor on the light shielding layer that lies under the passivation film;
   a pixel contact hole formed in the planarization film that exposes a part of the thin-film transistor;
   an anode on the planarization film that is connected to the thin-film transistor via the pixel contact hole,
   wherein the bank further comprises a light-emitting area exposing a center of the anode, wherein the organic emission layer is applied over the entire light-emitting area, wherein the cathode stacked on the organic emission layer in the light-emitting area, and wherein the anode, the organic emission layer, and the cathode overlap to form an organic light-emitting diode in the light-emitting area.

5. The organic light-emitting diode display of claim 4, wherein the connecting terminal has a three-layer structure comprising a metal material layer and transparent conductive layers stacked over and under the metal material layer.

6. The organic light-emitting diode display of claim 4, further comprising:
- a buffer layer that covers the light shielding layer and the auxiliary line and is stacked under an insulating film; and
- a source electrode and a drain electrode of the thin-film transistor that lie over the insulating film,
- wherein the auxiliary cathode is formed on the insulating film and comprises a same material as the source electrode and the drain electrode.

7. The organic light-emitting diode display of claim 1, wherein, in the under-cut opening, the end of the auxiliary cathode, the end of the connecting terminal, and the cathode are physically and electrically connected through direct contact with one another.

8. The organic light-emitting diode display of claim 1, further comprising a dummy bank that comes into direct contact with the end of the auxiliary cathode in the under-area.

9. The organic light-emitting diode display of claim 8, wherein the dummy bank comprises a same material as the bank.

10. The organic light-emitting diode display of claim 8, wherein the auxiliary cathode comprises:
- a first passivation metal layer; and
- a low-resistivity metal layer stacked on the first passivation metal layer; and
- a second passivation metal layer stacked on the low-resistivity metal layer.

11. The organic light-emitting diode display of claim 8, wherein the under-cut opening comprises:
- a first side where sidewalls of the planarization film and passivation film are etched; and
- a second side that exposes the end of the connecting terminal and the end of the auxiliary cathode, where the under-area is formed under the exposed end of the connecting terminal and the dummy bank fills part of the under-area.

12. The organic light-emitting diode display of claim 11, wherein the cathode on the first side of the under-cut opening extends to the dummy bank, and the cathode on the second side of the under-cut opening is physically and electrically connected to the connecting terminal through contact with the connecting terminal while wrapping the exposed end of the connecting terminal not covered by the organic emission layer,
- wherein the cathode and the auxiliary cathode are electrically connected via the connecting terminal.

* * * * *